United States Patent
Tseng et al.

(10) Patent No.: US 11,588,072 B2
(45) Date of Patent: Feb. 21, 2023

(54) SEMICONDUCTOR DEVICE AND SEMICONDUCTOR COMPONENT INCLUDING THE SAME

(71) Applicant: EPISTAR CORPORATION, Hsinchu (TW)

(72) Inventors: Yen-Chun Tseng, Hsinchu (TW); Kuo-Feng Huang, Hsinchu (TW); Shih-Chang Lee, Hsinchu (TW); Ming-Ta Chin, Hsinchu (TW); Shih-Nan Yen, Hsinchu (TW); Cheng-Hsing Chiang, Hsinchu (TW); Chia-Hung Lin, Hsinchu (TW); Cheng-Long Yeh, Hsinchu (TW); Yi-Ching Lee, Hsinchu (TW); Jui-Che Sung, Hsinchu (TW); Shih-Hao Cheng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 142 days.

(21) Appl. No.: 17/089,377

(22) Filed: Nov. 4, 2020

(65) Prior Publication Data
US 2021/0135052 A1 May 6, 2021

Related U.S. Application Data

(60) Provisional application No. 62/931,429, filed on Nov. 6, 2019.

(30) Foreign Application Priority Data

Jul. 17, 2020 (TW) .................................. 109124211

(51) Int. Cl.
*H01L 33/00* (2010.01)
*H01L 33/20* (2010.01)
(Continued)

(52) U.S. Cl.
CPC ............ *H01L 33/14* (2013.01); *H01L 33/025* (2013.01); *H01L 33/08* (2013.01); *H01L 33/20* (2013.01)

(58) Field of Classification Search
CPC ....... H01L 33/025; H01L 33/06; H01L 33/08; H01L 33/14; H01L 33/20
See application file for complete search history.

(56) References Cited

U.S. PATENT DOCUMENTS 6,974,967 B2 * 12/2005 Komori ................ H01L 29/127
257/17
7,098,482 B2 8/2006 Cho et al.
(Continued)

FOREIGN PATENT DOCUMENTS

| CN | 103811609 A | 5/2014 |
|----|----|----|
| JP | S58-197784 | 11/1983 |
| WO | WO-2007/037648 A1 | 4/2007 |

*Primary Examiner* — Savitri Mulpuri
(74) *Attorney, Agent, or Firm* — Muncy, Geissler, Olds & Lowe, P.C.

(57) ABSTRACT

A semiconductor device is provided, which includes a first semiconductor structure, a second semiconductor structure, and an active region. The first semiconductor structure includes a first dopant. The second semiconductor structure is located on the first semiconductor structure and includes a second dopant different from the first dopant. The active region includes a plurality of semiconductor pairs and is located between the first semiconductor structure and the second semiconductor structure. One of the plurality of semiconductor pairs has a barrier layer and a well layer and includes the first dopant. The barrier layer has a first thickness and a first Al content, and the well layer has a second thickness and a second Al content, the second thickness is less than the first thickness, and the second Al content is less than the first Al content.

7 Claims, 9 Drawing Sheets

(51) Int. Cl.
*H01L 33/14* (2010.01)
*H01L 33/08* (2010.01)
*H01L 33/02* (2010.01)

(56) References Cited

U.S. PATENT DOCUMENTS

| | | | |
|---|---|---|---|
| 7,705,344 B2 | 4/2010 | Lin et al. | |
| 11,114,586 B2 * | 9/2021 | Sugawara | H01L 33/18 |
| 11,127,879 B2 * | 9/2021 | Ye | H01L 33/0075 |
| 11,189,751 B2 * | 11/2021 | Jiang | H01L 33/12 |
| 11,227,974 B2 * | 1/2022 | Furusawa | H01L 33/06 |
| 11,302,843 B2 * | 4/2022 | Watanabe | H01L 33/145 |
| 2009/0236586 A1 | 9/2009 | Chen et al. | |
| 2017/0170360 A1 | 6/2017 | Bour et al. | |
| 2017/0263820 A1 * | 9/2017 | Lu | H01L 33/60 |
| 2020/0152830 A1 * | 5/2020 | Chen | H01L 33/50 |
| 2020/0287087 A1 * | 9/2020 | Watanabe | H01L 33/32 |

* cited by examiner

SEMICONDUCTOR DEVICE AND SEMICONDUCTOR COMPONENT INCLUDING IHE SAME

CROSS REFERENCE TO RELATED APPLICATIONS

This application claims the right of priority based on U.S. provisional patent application Ser. No. 62/931,429, filed on Nov. 6, 2019 and TW application Ser. No. 109,124,211, filed on Jul. 17, 2020, which also claims the benefit of U.S. provisional patent application Ser. No. 62/931,429, and each of which is incorporated by reference herein in their entirety.

FIELD OF DISCLOSURE

The present disclosure relates to a semiconductor device and in particular to a semiconductor light-emitting device such as a light-emitting diode.

BACKGROUND OF THE DISCLOSURE

Semiconductor devices are widely used in many applications. Various researches and developments of related material used in the semiconductor devices have been conducted. For example, a group III-V semiconductor material containing a group III element and a group V element may be applied to various optoelectronic devices, such as light emitting diodes (LEDs), laser diodes (LDs), photoelectric detectors, solar cells or power devices, such as switches or rectifiers. In recent years, the optoelectronic devices have been widely applied in fields including lighting, medical, display, communication, and sensing systems. The light-emitting diode, which is one of the semiconductor light-emitting devices, has low energy consumption and long operating lifetime, and is therefore widely used in various fields.

SUMMARY OF THE DISCLOSURE

The present disclosure provides a semiconductor device. The semiconductor device includes a first semiconductor structure, a second semiconductor structure, and an active region. The first semiconductor structure includes a first dopant. The second semiconductor structure is located on the first semiconductor structure and includes a second dopant different from the first dopant. The active region includes a plurality of semiconductor pairs and is located between the first semiconductor structure and the second semiconductor structure. One of the plurality of semiconductor pairs has a barrier layer and a well layer and includes the first dopant. The barrier layer has a first thickness and a first Al content, and the well layer has a second thickness and a second Al content, the second thickness is less than the first thickness, and the second Al content is less than the first Al content.

The present disclosure provides a semiconductor device. The semiconductor device includes a first semiconductor structure, a second semiconductor structure, and an active region. The first semiconductor structure includes a first dopant. The second semiconductor structure is located on the first semiconductor structure and includes a second dopant different from the first dopant. The active region is located between the first semiconductor structure and the second semiconductor structure and includes the first dopant. In an operating current range of 0.01 mA to 5 mA or in a current density range of 0.01 A/cm² to 5 A/cm², the semiconductor device has a maximum EQE value of $E_{max}$% at a current density of $J\_E_{max}$ A/cm², and has a first EQE value greater than or equal to 15% of $E_{max}$% at a current density of $0.001*(J\_E_{max})$ A/cm².

DETAILED DESCRIPTION OF THE DISCLOSURE

Figure 1A:
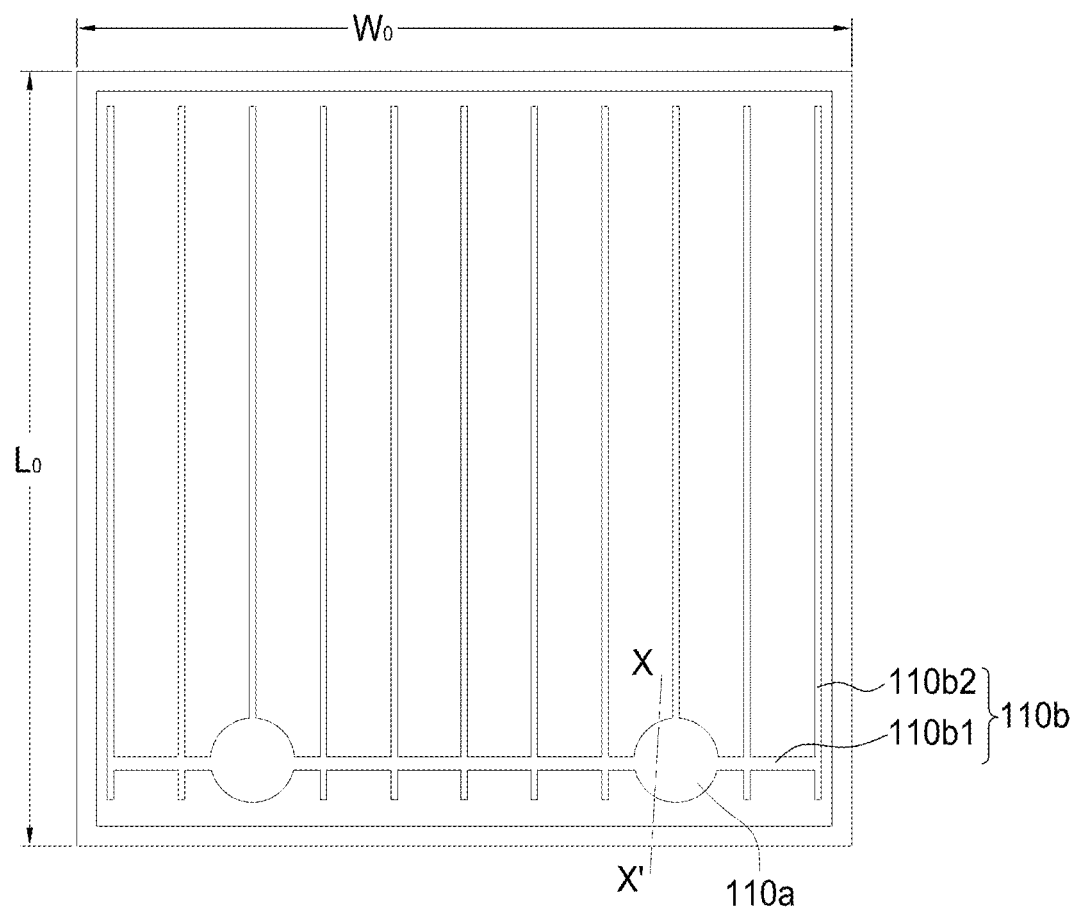
FIG. 1A shows a schematic top view of a semiconductor device in accordance with an embodiment of the present disclosure.

The following embodiments will be described with accompany drawings to disclose the concept of the present disclosure. In the drawings or description, same or similar portions are indicated with same or similar numerals. Furthermore, a shape or a thickness of a member in the drawings may be enlarged or reduced. Particularly, it should be noted that a member which is not illustrated or described in drawings or description may be in a form that is known by a person skilled in the art.

In the present disclosure, if not otherwise specified, the general formula InGaP represents $In_{x0}Ga_{1-x0}P$, wherein $0<x0<1$; the general formula AlInP represents $Al_{x1}In_{1-x1}P$, wherein $0<x1<1$; the general formula AlGaInP represents $Al_{x2}Ga_{x3}In_{1-x2-x3}P$, wherein $0<x2<1$ and $0<x3<1$; the general formula InGaAsP represents $In_{x4}Ga_{1-x4}As_{x5}P_{1-x5}$, wherein $0<x4<1$ and $0<x5<1$; the general formula AlGaInAs represents $Al_{x6}Ga_{x7}In_{1-x6-x7}As$, wherein $0<x6<1$ and $0<x7<1$; the general formula InGaNAs represents $In_{x8}Ga_{1-x8}N_{x9}As_{1-x9}$, wherein $0<x8<1$ and $0<x9<1$; the general formula InGaAs represents $In_{x10}Ga_{1-x10}As$, wherein $0<x10<1$; the general formula AlGaAs represents $Al_{x11}Ga_{1-x11}As$, wherein $0<x11<1$; the general formula InGaN represents $In_{x12}Ga_{1-x12}N$, wherein $0<x12<1$; the general formula AlGaN represents $Al_{x13}Ga_{1-x13}N$, wherein $0<x13<1$; the general formula AlGaAsP represents $Al_{x14}Ga_{1-x14}As_{x15}P_{1-x15}$, wherein $0<x14<1$ and $0<x15<1$; the general formula InGaAsN represents $In_{x16}Ga_{1-x16}As_{x17}N_{1-x17}$, wherein $0<x16<1$ and $0<x17<1$; the general formula AlInGaN represents $Al_{x18}In_{x19}Ga_{1-x18-x19}N$, wherein $0<x18<1$ and $0<x19<1$. The content of each element may be adjusted for different purposes, for example, for adjusting the energy gap, or the peak wavelength or dominant wavelength when the semiconductor device is a light-emitting device.

The semiconductor device of the present disclosure is, for example, a light-emitting device (such as a light-emitting diode, or a laser diode), a light absorbing device (such as a photo-detector) or a non-illumination device. Qualitative or quantitative analysis of the composition and/or dopant contained in each layer of the semiconductor device of the present disclosure may be conducted by any suitable method, for example, a secondary ion mass spectrometer (SIMS). A thickness of each layer may be obtained by any suitable method, such as a transmission electron microscopy (TEM) or a scanning electron microscope (SEM).

A person skilled in the art can realize that other members can be included based on a structure recited in the following embodiments. For example, if not otherwise specified, a description similar to "a first layer/structure is on or under a second layer/structure" can include an embodiment in which the first layer/structure contacts directly (or physically) contacts the second layer/structure, and can also include an embodiment in which another structure is provided between the first layer/structure and the second layer/structure, such that the first layer/structure and the second layer/structure do not physically contact each other. In addition, it should be realized that a positional relationship of a layer/structure may be altered when being observed in different orientations.

Furthermore, in the present disclosure, a description of "a layer/structure only includes M material" means the M material is the main constituent of the layer/structure; however, the layer/structure may still contain a dopant or unavoidable impurities.

Figure 1B:
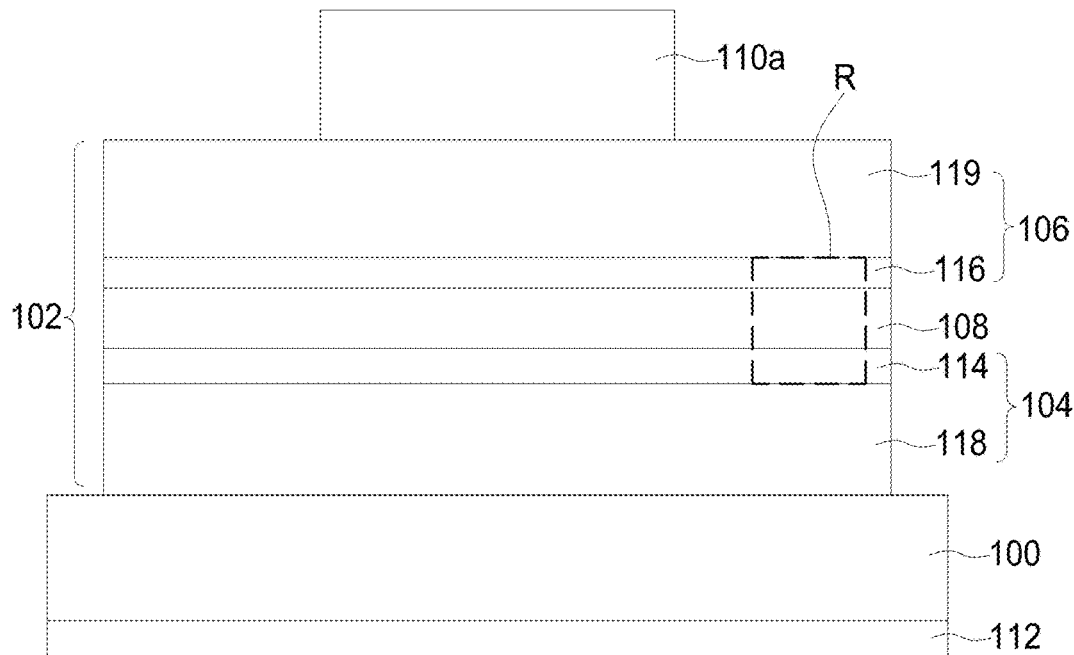
FIG. 1B and FIG. 1C show a schematic sectional view and a partial enlarged view of the semiconductor device.
Figure 1C:
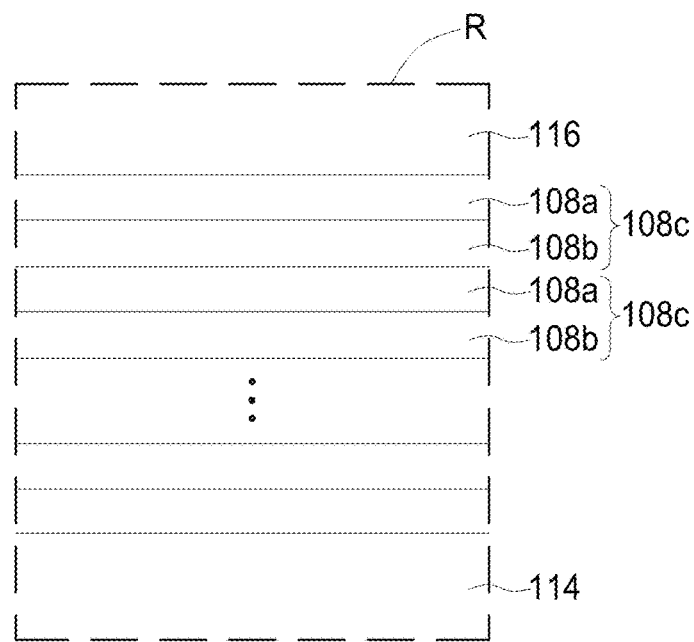

FIG. 1A shows a schematic top view of a semiconductor device 10 in accordance with an embodiment of the present disclosure. FIG. 1B shows a schematic sectional view of the semiconductor device 10 along X-X' line in FIG. 1A. FIG. 1C shows a partial enlarged view of a region R in the semiconductor device 10. As shown in FIG. 1A, in the top view, the semiconductor device 10 has a length $L_0$ and a width $W_0$. In an embodiment, the length $L_0$ and width $W_0$ are less than or equal to 500 µm, for example, less than or equal to 450 µm, 400 µm, 350 µm, 300 µm, 250 µm, 200 µm, 150 µm, 100 µm, 50 µm, 30 µm, or 10 µm, and are greater than or equal to 1 µm. In an embodiment, the top view of the semiconductor device 10 is rectangular or circular. In an embodiment, the length $L_0$ and the width $W_0$ of the semiconductor device 10 are equal so that the semiconductor device 10 has a square shape. In an embodiment, in the top view, an area ($L_0*W_0$) of an upper surface of the semiconductor device 10 is 10000 µm² or less, for example, in the range of 1 µm² to 5000 µm² (such as 100 µm², 625 µm², 1250 µm², 2000 µm² or 2500 µm²). As shown in FIGS. 1A and 1B, the semiconductor device 10 includes a base 100, an epitaxial structure 102, a first electrode 110, and a second electrode 112. The epitaxial structure 102 is located on the base 100. The first electrode 110 is located on the epitaxial structure 102 and the second electrode 112 is located under the base 100.

The base 100 includes a conductive or an insulating material, such as gallium arsenide (GaAs), indium phosphide (InP), silicon carbide (SiC), gallium phosphide (GaP), zinc oxide (ZnO), gallium nitride (GaN), aluminum nitride (AlN), germanium (Ge) or silicon (Si). The insulating material is, for example, sapphire. In an embodiment, the base 100 is a growth substrate, that is, the epitaxial structure 102 is formed on the base 100 by, for example, metal organic chemical vapor deposition (MOCVD). In an embodiment, the base 100 is a bonding substrate instead of a growth substrate, and it can be bonded to the epitaxial structure 102 via an adhesive material.

As shown in FIG. 1B, the epitaxial structure 102 includes a first semiconductor structure 104, a second semiconductor structure 106, and an active region 108 between the first semiconductor structure 104 and the second semiconductor structure 106. In an embodiment, the first semiconductor structure 104 and the second semiconductor structure 106 have different conductivity types. For example, the first semiconductor structure 104 is n-type and the second semiconductor structure 106 is p-type, or the first semiconductor structure 104 is p-type and the second semiconductor structure 106 is n-type. The first semiconductor structure 104 and the second semiconductor structure 106 respectively provide electrons and holes, or holes and electrons. In an embodiment, the first semiconductor structure 104, the second semiconductor structure 106, and the active region 108 respectively includes a group III-V semiconductor material. In an embodiment, the group III-V semiconductor material contains element(s) of Al, Ga, As, P, N or In. In an embodiment, the first semiconductor structure 104, the second semiconductor structure 106, and the active region 108 do not include element N. Specifically, in an embodiment, the group III-V semiconductor material is a binary compound semiconductor (such as GaAs, GaP or GaN), a ternary compound semiconductor (such as InGaAs, AlGaAs, InGaP, AlInP, InGaN or AlGaN) or a quaternary compound semiconductor (such as AlGaInAs, AlGaInP, AlInGaN, InGaAsP, InGaAsN or AlGaAsP). In an embodiment, the active region 108 only includes a ternary compound semiconductor (such as InGaAs, AlGaAs, InGaP, AlInP, InGaN, or AlGaN) or a quaternary compound semiconductor (such as AlGaInAs, AlGaInP, AlInGaN, InGaAsP, InGaAsN, or AlGaAsP).

In an embodiment, the semiconductor device 10 includes a double heterostructure (DH), a double-side double heterostructure (DDH), or a multiple quantum wells (MQW) structure. In accordance with an embodiment, when the semiconductor device 10 is a light emitting device, the active region 108 can emit a light during operation. The light includes visible light or invisible light. The peak wavelength of the light emitted is determined by the material composition of the active region 108. For example, when the material of the active region 108 includes InGaN, a blue light or a deep blue light with a peak wavelength of 400 nm to 490 nm, or a green light with a peak wavelength of 490 nm to 550 nm can be emitted; when the material of the active region 108 contains AlGaN, for example, an ultraviolet light with a peak wavelength of 250 nm to 400 nm can be emitted; when the material of the active region 108 contains InGaAs, InGaAsP, AlGaAs or AlGaInAs, for example, an infrared light with a peak wavelength of 700 nm to 1700 nm can be emitted; when the material of the active region 108 contains InGaP or AlGaInP, for example, a red light with a peak wavelength of 610 nm to 700 nm or a yellow light with a peak wavelength of 530 nm to 600 nm can be emitted.

In an embodiment, the active region 108 includes a semiconductor pair 108c having a barrier layer 108a and a well layer 108b adjacent to the barrier layer 108a. In an embodiment, the semiconductor pair 108c is composed of one barrier layer 108a and one well layer 108b. Specifically, the active region 108 may include one or more semiconductor pairs 108c. In an embodiment, the number of the semiconductor pair 108c in the active region 108 is greater than or equal to two. In an embodiment, the number of the semiconductor pair 108c is less than or equal to 20, or is less than or equal to 10. The number of the semiconductor pairs 108c is, for example, 3, 4, 5, 6, 7, 8, 9, 10, 11, 12, 13, 14, 15, 16, 17, 18, or 19. In an embodiment, when the number of the semiconductor pair 108c in the active region 108 is less than 5 (i.e., five or less barrier layers 108a and five or less well layers 108b), the semiconductor device 10 can have a relatively high quantum efficiency. In an embodiment, when the semiconductor device 10 is operated at a low current density (such as 1 A/cm$^2$ or less) or a low current (such as 10 mA or less), the semiconductor device 10 can have a better efficiency. Specifically, in an embodiment, the current density is obtained by dividing the current applied to the semiconductor device 10 (in amperes (A)) by the top-view area of the epitaxial structure 102 (in cm$^2$). In an embodiment, the top-view area of the epitaxial structure 102 is in the range of 1 µm$^2$ to 2500 µm$^2$, such as 50 µm$^2$ to 100 µm$^2$, 600 µm$^2$, 1200 µm$^2$, 1500 µm$^2$ or 2000 µm$^2$. In some embodiments, the epitaxial structure 102 has multiple areas of different sizes in the top view, and the top-view area refers to the largest one of these areas.

In an embodiment, the barrier layer 108a and/or the well layer 108b include aluminum. In an embodiment, the active region 108 includes n semiconductor pairs 108c (i.e. the active region 108 contains n barrier layers 108a and $n$ well layers 108b), wherein n is a positive integer, each barrier layer 108a has a first aluminum (Al) content (ai %, i=1, 2 . . . n), and each well layer 108b has a second aluminum (Al) content (bi %, i=1, 2 . . . n). Specifically, a1% refers to the first Al content of a $1_{st}$ barrier layer 108a, a2% refers to the first Al content of a $2_{nd}$ barrier layer 108a, and an % refers to the first Al content of a $n_{th}$ barrier layer 108a; b1% refers to the second Al content of a $1_{st}$ well layer 108b, b2% refers to the second Al content of a $2_{nd}$ well layer 108b, and bn % refers to the second Al content of a $n_{th}$ well layer 108b. The first Al contents of these barrier layers 108a may be the same or different. In an embodiment, the differences in Al % between the barrier layers 108a is between 0 and 1 atom % (both included). The second Al contents of the well layers 108b may be the same or different. In an embodiment, the differences in Al % between the well layers 108b is between 0 and 1 atom % (both included).

Specifically, the first and second Al contents respectively refer to the atomic percentage (atom %) of Al in the barrier layer 108a and the well layer 108b. In an embodiment, the first and second Al contents can be obtained by measuring the atom % of Al in the barrier layer 108a and the well layer 108b via an Energy Dispersive Spectrometer (EDX). For example, when the barrier layer 108a contains $Al_{z1}Ga_{0.5-z1}In_{0.5}P$ (wherein 0≤z1≤0.5) and the well layer 108b contains $Al_{z2}Ga_{0.5-z2}In_{0.5}P$ (wherein 0≤z2≤0.5), z1 and z2 can be obtained by EDX analysis. Here, the first Al content (ai %) of the barrier layer 108a can be defined as z1*100%, and the second Al content (bi %) of the well layer 108b can be defined as z2*100%. That is, the Al content refers to the ratio of Al to the sum of the atomic percentages of all group III elements. For example, when z1=0.3, it means that the first Al content is 30%. In an embodiment, the Al content of the barrier layer 108a and the well layer 108b can also be obtained by SIMS analysis. In an embodiment, the first Al content is greater than the second Al content. In an embodiment, the first Al content is in a range of 15% to 50%, such as 20%, 25%, 30%, 35%, 40%, 45%, or 50%. In an embodiment, the second Al content is in a range of 0% to 15%, such as 5% or 10%. In an embodiment, when the first Al content is greater than or equal to 25%, the ability of the barrier layer 108a to confine electrons can be further improved, and the semiconductor device can have a better quantum efficiency (such as EQE or IQE). In an embodiment, when the first Al content is greater than or equal to 35%, the quantum efficiency can be further improved.

In an embodiment, the active region 108 includes n semiconductor pairs 108c and thus has n barrier layers 108a and $n$ well layers 108b, where n is a positive integer. Each barrier layer 108a has a first thickness (t1i, i=1, 2 . . . n), and each well layer 108b has a second thickness (t2i, i=1, 2 . . . n). In an embodiment, the first thickness is greater than or equal to the second thickness. Specifically, t11 refers to the first thickness of a $1_{st}$ barrier layer 108a, t12 refers to the first thickness of a $2_{nd}$ barrier layer 108a, t1n refers to the first thickness of a $n_{th}$ barrier layer 108a; t21 refers to the second thickness of a $1_{st}$ well layer 108b; t22 refers to the second thickness of a $2_{nd}$ well layer 108b, and t2n refers to the second thickness of a $n_{th}$ well layer 108b. The first thicknesses of the barrier layers 108a may be the same or different. In an embodiment, the difference between the first thicknesses of the barrier layers 108a is between 0 and 1 nm (both included). The second thicknesses of the well layers 108b may be the same or different. In an embodiment, the difference between the second thicknesses of the well layers 108b is between 0 to 1 nm (both included). In an embodiment, the first thickness and the second thickness are less than or equal to 200 Å, for example, about 150 Å, 100 Å, 50 Å, or 10 Å. In an embodiment, when the thicknesses of the barrier layer 108a and the well layer 108b are all less than or equal to 200 Å, the semiconductor device 10 can have a better quantum efficiency. In some embodiments, the ratio of the first thickness (t1i) to the second thickness (t2i) is in a range of 2:1 to 40:1. For example, the ratio of the first thickness to the second thickness (t1i/t2i) may be in the range of 10:1 to 35:1. By having a relatively larger first thickness, the ability of the barrier layer 108a to confine electrons can be improved. In an embodiment, the first thickness is in the range of 20 Å to 4000 Å, for example, greater than or equal to 100 Å and less than or equal to 2000 Å. In an embodiment, the second thickness is in the range of 10 Å to 200 Å, such as 150 Å, 100 Å, or 50 Å.

As shown in FIG. 1B, the first semiconductor structure 104 includes a first confinement layer 114, and the second semiconductor structure 106 includes a second confinement layer 116. In the embodiment, the first confinement layer 114 and the second confinement layer 116 are adjacent to the active region 108 and physically contact the active region 108. In an embodiment, the first confinement layer 114 and the second confinement layer 116 respectively include a group III-V semiconductor material, such as a ternary compound semiconductor (such as InGaAs, AlGaAs, InGaP, AlInP, InGaN or AlGaN) or a quaternary compound semiconductor (such as AlGaInAs, AlGaInP, AlInGaN, InGaAsP, InGaAsN or AlGaAsP). In an embodiment, the first confinement layer 114 and the second confinement layer 116 have the same material as the barrier layer 108a. In an embodiment, the first confinement layer 114 and/or the second confinement layer 116 include aluminum. In an embodiment, the first confinement layer 114 has a third Al content, and the second confinement layer 116 has a fourth Al content. As mentioned above, the Al content refers to the ratio of Al to the sum of the atomic percentages of all group III elements. In an embodiment, the third Al content and the fourth Al content are greater than the second Al content. In an embodiment, the third Al content and the fourth Al content are greater than or equal to the first Al content. In an embodiment, the first confinement layer 114 has a third thickness (t3), and the second confinement layer 116 has a fourth thickness (t4). The third thickness and the fourth thickness may be the same or different. In an embodiment, the third thickness is greater than or equal to the second thickness, and the fourth thickness is greater than or equal to the second thickness, thereby the ability of the first confinement layer 114 and the second confinement layer 116 to confine electrons can be elevated. In an embodiment, the ratio of the third thickness to the first thickness or the second thickness (t3/t1i or t3/t2i) is in a range of 1.5:1 to 10:1 (such as 2:1, 3:1, 4:1, 5:1, 6:1, 7:1, 8:1, or 9:1). In an embodiment, the ratio of the fourth thickness to the first thickness or the second thickness (t4/t1i or t4/t2i) is in a range of 1.5:1 to 10:1 (such as 2:1, 3:1, 4:1, 5:1, 6:1, 7:1, 8:1, or 9:1). In an embodiment, when t3/t1i, t3/t2i, t4/t1i, or t4/t2i falls within the above range, the abilities of the first confinement layer 114 and/or the second confinement layer 116 to confine electrons can be further improved.

In an embodiment, the active region 108 includes a first dopant. The first dopant has a doping concentration in the active region 108. The first dopant is an n-type or a p-type dopant to the active region 108. In an embodiment, the first dopant includes a group II, group IV, or group VI element in the periodic table. In an embodiment, the first dopant includes C, Zn, Si, Ge, Sn, Se, Mg or Te. In an embodiment, the doping concentration of the first dopant in the active region 108 is greater than or equal to $1 \times 10^{16}/cm^3$. In an embodiment, the doping concentration of the first dopant in the active region 108 is less than $1 \times 10^{18}/cm^3$. Specifically, the doping concentration of the first dopant in the active region 108 may be in the range of $5 \times 10^{15}/cm^3$ to $1 \times 10^{16}/cm^3$, such as $5 \times 10^{15}/cm^3$ to $5 \times 10^{16}/cm^3$, $8 \times 10^{16}/cm^3$, $1 \times 10^{17}/cm^3$ or $5 \times 10^{17}/cm^3$. In an embodiment, the first dopant is also distributed in the first semiconductor structure 104 and/or the second semiconductor structure 106. In an embodiment, the doping concentration of the first dopant in the first semiconductor structure 104 is higher than the doping concentration of the first dopant in the active region 108. In an embodiment, the first dopant is distributed in the first confinement layer 114 and the active region 108. In an embodiment, the first dopant is continuously distributed in the first confinement layer 114 and the active region 108 and has a doping concentration greater than or equal to $1 \times 10^{16}/cm^3$. The description "continuously distributed in the first confinement layer 114 and the active region 108" means that when analyzing the first confinement layer 114 and the active region 108 by SIMS, the signal of the first dopant can be obtained at all depth positions in the first confinement layer 114 and the active region 108. Specifically, in an embodiment, when analyzing the first dopant by SIMS, it can be found that the first dopant is distributed from a surface of the first confinement layer 114 away from the active region 108 to an interface between the active region 108 and the second confinement layer 116, and also distributed in each barrier layer 108a and each well layer 108b of the active region 108.

In an embodiment, in a semiconductor pair 108c which is closest to the first confinement layer 114, the doping concentration of the first dopant is $1 \times 10^{16}/cm^3$ or more and $1 \times 10^{18}/cm^3$ or less. In an embodiment, in a semiconductor pair 108c which is closest to the second confinement layer 116, the doping concentration of the first dopant is $1 \times 10^{16}/cm^3$ or more and $1 \times 10^{17}/cm^3$ or less. In an embodiment, the doping concentration of the first dopant in the semiconductor pair 108c closest to the first confinement layer 114 is greater than or equal to the doping concentration of the first dopant in the semiconductor pair 108c closest to the second confinement layer 116. In an embodiment, the first dopant is distributed in the first confinement layer 114, the second confinement layer 116 and the active region 108. In an embodiment, the doping concentration of the first dopant in the first confinement layer 114 is greater than or equal to the doping concentration of the first dopant in the active region 108. In an embodiment, the doping concentration of the first dopant in the active region 108 is greater than or equal to the doping concentration of the first dopant in the second confinement layer 116. In an embodiment, the doping concentration of the first dopant gradually decreases from the first confinement layer 114 to the second confinement layer 116. Specifically, in an embodiment, in the first confinement layer 114 the first dopant has a minimum doping concentration c1, in the second confinement layer 116 the first dopant has a minimum doping concentration c2, and in the active region 108 the first dopant has a minimum doping concentration c3, wherein c1≥c3≥c2. The minimum doping concentrations c1, c2, and c3 refer to the minimum doping concentrations of the first dopant in the first confinement layer 114, the second confinement layer 116, and the active region 108, respectively. When analyzing the first dopant by SIMS, the minimum doping concentrations respectively correspond to the lowest valley positions of the concentration curve of the first dopant in the first confinement layer 114, the second confinement layer 116, and the active region 108 in the SIMS analysis results (in absence of any obvious valley, the lowest valley position refers to the minimum detectable concentration).

In an embodiment, the first semiconductor structure 104 further includes a first cladding layer 118 located under the first confinement layer 114. In an embodiment, the first cladding layer 118 includes a group III-V semiconductor material, such as a ternary compound semiconductor (for example, InGaAs, AlGaAs, InGaP, AlInP, InGaN or AlGaN) or a quaternary compound semiconductor (for example, AlGaInAs, AlGaInP, AlInGaN, InGaAsP, InGaAsN or AlGaAsP). In an embodiment, the first cladding layer 118 also includes the first dopant. In an embodiment, the doping concentration of the first dopant in the first cladding layer 118 is greater than or equal to the doping concentration of the first dopant in the first confinement layer 114.

In an embodiment, the first semiconductor structure 104 further include a first window layer (not shown) located under the first cladding layer 118. In an embodiment, the first window layer includes a group III-V semiconductor material, such as a ternary compound semiconductor (for example, InGaAs, AlGaAs, InGaP, AlInP, InGaN, or AlGaN) or a quaternary compound semiconductor (for example, AlGaInAs, AlGaInP, AlInGaN, InGaAsP, InGaAsN, or AlGaAsP). In an embodiment, the material of the first window layer and the first cladding layer 118 is different. In an embodiment, the thickness of the first window layer is greater than the thickness of the first cladding layer 118. In an embodiment, the first window layer includes the first dopant. In an embodiment, the doping concentration of the first dopant in the first window layer is greater than or equal to the doping concentration of the first dopant in the first cladding layer 118 or the doping concentration of the first dopant in the first confinement layer 114. In an embodiment, in the first cladding layer 118 and/or the first window layer, the doping concentration of the first dopant is less than or equal to $1 \times 10^{19}/cm^3$, for example, in a range of $5 \times 10^{17}/cm^3$ to $1 \times 10^{18}/cm^3$, $2 \times 10^{18}/cm^3$ or $3 \times 10^{18}/cm^3$.

In an embodiment, the second semiconductor structure 106 further includes a second cladding layer 119 located on the second confinement layer 116. In an embodiment, the second cladding layer 119 includes a group III-V semiconductor material, such as a ternary compound semiconductor (for example, InGaAs, AlGaAs, InGaP, AlInP, InGaN, or AlGaN) or a quaternary compound semiconductor (for example, AlGaInAs, AlGaInP, AlInGaN, InGaAsP, InGaAsN or AlGaAsP). In an embodiment, the second cladding layer 119 includes a second dopant different from the first dopant. In an embodiment, the second dopant includes a group II, group IV, or group VI element in the periodic table. In an embodiment, the second dopant includes C, Zn, Si, Ge, Sn, Se, Mg or Te. In an embodiment, the second dopant is also distributed in the active region 108 and/or the second confinement layer 116. In an embodiment, the first dopant and the second dopant coexist in the second confinement layer 116 and/or the second cladding layer 119. In an embodiment, the second dopant in the second confinement layer 116 and/or the second cladding layer 119 have a doping concentration greater than or equal to $1 \times 10^{16}/cm^3$.

In an embodiment, the first semiconductor structure 104 includes a third dopant different from the first dopant and the second dopant. In an embodiment, the third dopant is distributed in the first cladding layer 118 and/or the first window layer. In an embodiment, the first dopant is distributed in the first cladding layer 118, the first confinement layer 114, and the active region 108, and the third dopant is mainly distributed in the first window layer. In an embodiment, the first dopant and the third dopant do not coexist in the first confinement layer 114, the active region 108, the first cladding layer 118, or the first window layer. In an embodiment, in the first confinement layer 114, the active region 108, the first cladding layer 118 or the first window layer, the minimum doping concentration of one of the first dopant and the third dopant is lower than $1 \times 10^{16}/cm^3$. In an embodiment, the third dopant includes a group II, group IV, or group VI element in the periodic table. In an embodiment, the third dopant includes C, Zn, Si, Ge, Sn, Se, Mg or Te. In an embodiment, the atomic radius of the third dopant is smaller than the atomic radius of the first dopant or the second dopant. In an embodiment, for the first semiconductor structure 104, the first dopant and the third dopant have the same conductivity type, and the second dopant has a different conductivity type. For example, for the first semiconductor structure 104, the first and third dopants are p-type dopants, and the second dopant is an n-type dopant, or the first dopants and third dopants are n-type dopants, and the second dopant is a p-type dopant.

In an embodiment, the first dopant is continuously distributed from the first cladding layer 118 to the second confinement layer 116. For example, when analyzing the region from the first cladding layer 118 to the second confinement layer 116 by SIMS, the signal of the first dopant can be obtained at each depth position from the cladding layer 118 to the second confinement layer 116. In an embodiment, the second dopant is continuously distributed in the second cladding layer 119. For example, when analyzing the second cladding layer 119 by SIMS, the signal of the second dopant can be obtained at each depth position in the second cladding layer 119. In an embodiment, the third dopant is continuously distributed in the first window layer. For example, when the first window layer is analyzed by SIMS, the signal of the third dopant can be obtained each depth position in the first window layer. In an embodiment, the doping concentration of the second dopant in the second confinement layer 116 is slightly less than the doping concentration of the second dopant in the second cladding layer 119. In an embodiment, the doping concentration of the third dopant in the first window layer is greater than the doping concentration of the third dopant in the first cladding layer 118. In an embodiment, the first dopant and the third dopant coexist at the interface between the first window layer and the first cladding layer 118.

The first electrode 110 and the second electrode 112 are used for electrical connection with an external power source. The materials of the first electrode 110 and the second electrode 112 may be the same or different, for example, each includes a metal oxide, a metal, or an alloy. Examples of the metal oxide include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO) or indium zinc oxide (IZO). Examples of the metal include germanium (Ge), beryllium (Be), zinc (Zn), gold (Au), platinum (Pt), titanium (Ti), aluminum (Al), nickel (Ni), or copper (Cu). In an embodiment, the alloy includes at least two selected from the metals, such as germanium gold nickel (GeAuNi), beryllium gold (BeAu), germanium gold (GeAu), or zinc gold (ZnAu). As shown in FIG. 1A, in the embodiment, the first electrode 110 includes an electrode pad 110a and an extension electrode 110b connected to the electrode pad 110a. In the embodiment, the extension electrode 110b includes a first extension portion 110b1 and a second extension portion 110b2. The first extension 110b1 physically contacts the electrode pad 110a, and the second extension 110b2 physically contacts the first extension 110b1 and extends in a direction perpendicular to the first extension 110b1. In an embodiment, the semiconductor device 10 just has one electrode pad 110a.

Figure 1D:
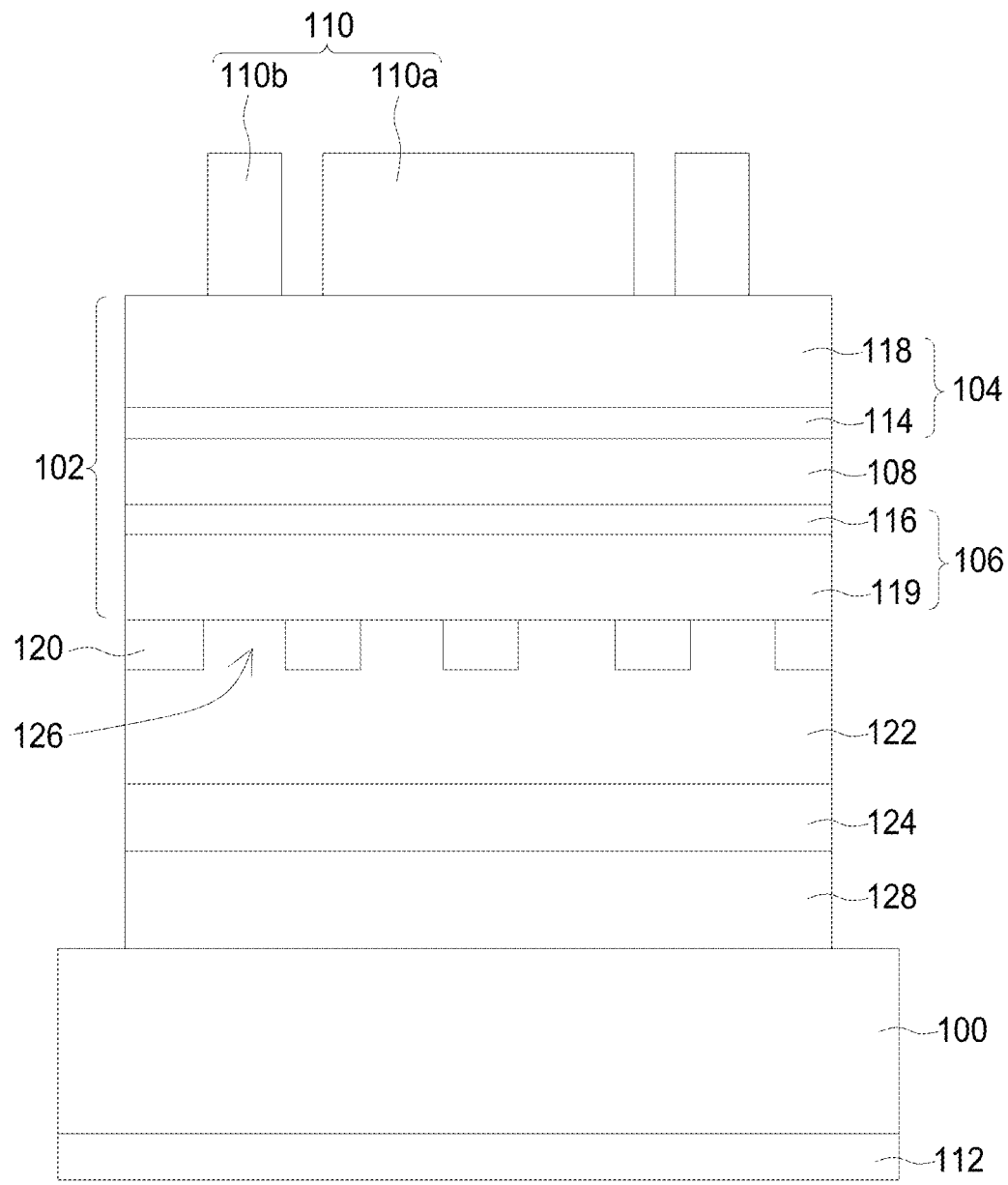
FIG. 1D shows a schematic sectional view of a semiconductor device in accordance with an embodiment of the present disclosure.

FIG. 1D is a schematic cross-sectional structure diagram of the semiconductor device 20 in accordance with an embodiment of the disclosure. The difference between the semiconductor device 20 of the embodiment and the semiconductor device 10 includes that the semiconductor device 20 further includes an insulating layer 120, a conductive layer 122, a reflective layer 124 and a bonding structure 128. The insulating layer 120, the conductive layer 122, the reflective layer 124 and the bonding structure 128 are located between the epitaxial structure 102 and the base 100. In the embodiment, the insulating layer 120 physically contacts the second semiconductor structure 106 and the first electrode 110 is located on, physically contacts, and is electrically connected to the first semiconductor structure 104. The conductive layer 122 physically contacts the insulating layer 120, the reflective layer 124 physically contacts the conductive layer 122, and the bonding structure 128 is located between the base 100 and the reflective layer 124.

In an embodiment, the insulating layer 120 is a patterned dielectric layer. In an embodiment, the insulating layer 120 includes an insulating material with a refractive index less than 2, such as silicon nitride ($SiN_x$), aluminum oxide ($AlO_x$), and silicon oxide ($SiO_x$), magnesium fluoride ($MgF_x$) or a combination thereof. In an embodiment, x=1.5 or 2. As shown in FIG. 1D, the insulating layer 120 has a plurality of pores 126, the conductive layer 122 can physically contact the insulating layer 120 and fill the pores 126, and the conductive layer 122 and the epitaxial structure 102 can form a contact area at the pores 126. Thereby, the conductive layer 122 can be electrically connected to the epitaxial structure 102. In an embodiment, the conductive layer 122 includes a metal or a metal oxide. The metal may include silver (Ag), germanium (Ge), gold (Au), nickel (Ni), or a combination thereof. The metal oxide may include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO), indium zinc oxide (IZO), or a combination of the above materials.

In an embodiment, the reflective layer 124 reflects the light emitted from the active region 108 to exit the semiconductor device 20 toward the first electrode 110. The reflective layer 124 may include a semiconductor material, metal, or alloy. The semiconductor material may include a group III-V semiconductor material, such as a binary, ternary or quaternary group II-V semiconductor material. In an embodiment, the metal includes copper (Cu), aluminum (Al), tin (Sn), gold (Au), silver (Ag), lead (Pb), titanium (Ti), nickel (Ni), platinum (Pt) or tungsten (W). In an embodiment, the alloy includes at least two selected from the aforementioned metals. In an embodiment, the reflective layer 124 includes a distributed Bragg reflector (DBR) structure. The DBR structure can be formed by alternately stacking two or more semiconductor materials with different refractive indexes, for example, AlAs/GaAs, AlGaAs/GaAs or InGaP/GaAs.

The bonding structure 128 connects the base 100 and the reflective layer 124. The bonding structure 128 may be a single layer or multiple layers (not shown). In an embodiment, the material of the bonding structure 128 includes a transparent conductive material, a metal, or an alloy. In an embodiment, the transparent conductive material includes indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), zinc oxide (ZnO), gallium phosphide (GaP), indium cerium oxide (ICO), indium tungsten oxide (IWO), indium titanium oxide (ITiO), indium zinc oxide (IZO), indium gallium oxide (IGO), gallium aluminum zinc oxide (GAZO), graphene or a combination of the aforementioned materials. In an embodiment, the metal includes copper (Cu), aluminum (Al), tin (Sn), gold (Au), silver (Ag), lead (Pb), titanium (Ti), nickel (Ni), platinum (Pt) or tungsten (W). In an embodiment, the alloy includes at least two selected from the aforementioned metals.

Although the first semiconductor structure 104 is shown on the active region 108 and the second semiconductor structure 106 is below the active region 108 in FIG. 1D, in another embodiment, the following configuration is provided: the first semiconductor structure 104 is located under the active region 108 and physically contacts the insulating layer 120 and the conductive layer 122, and the second semiconductor structure 106 is located on the active region 108 and physically contacts the first electrode 110. For the positions, materials, and related descriptions of other layers or structures, the foregoing embodiments can be referred to, and are not repeatedly described herein.

Figure 1E:
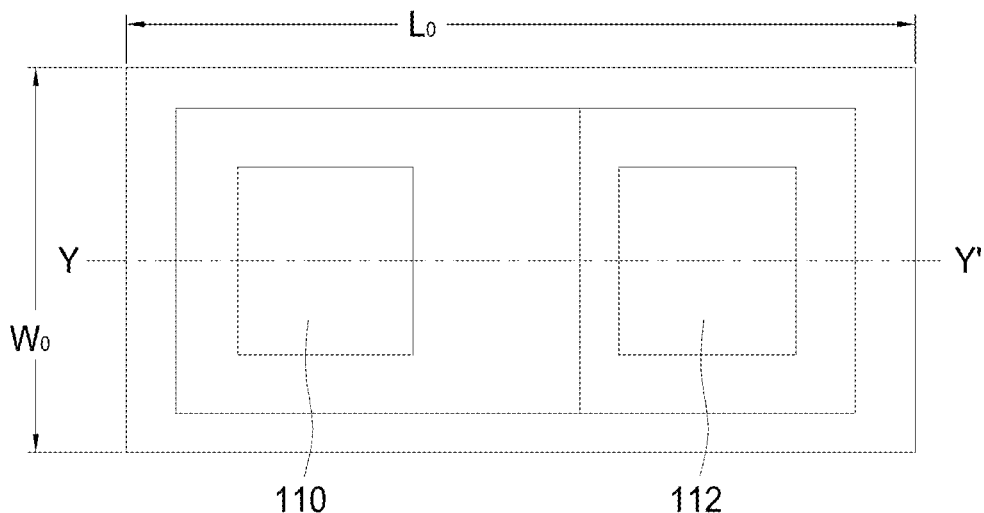
FIG. 1E shows a schematic top view of a semiconductor device in accordance with an embodiment of the present disclosure.
Figure 1F:
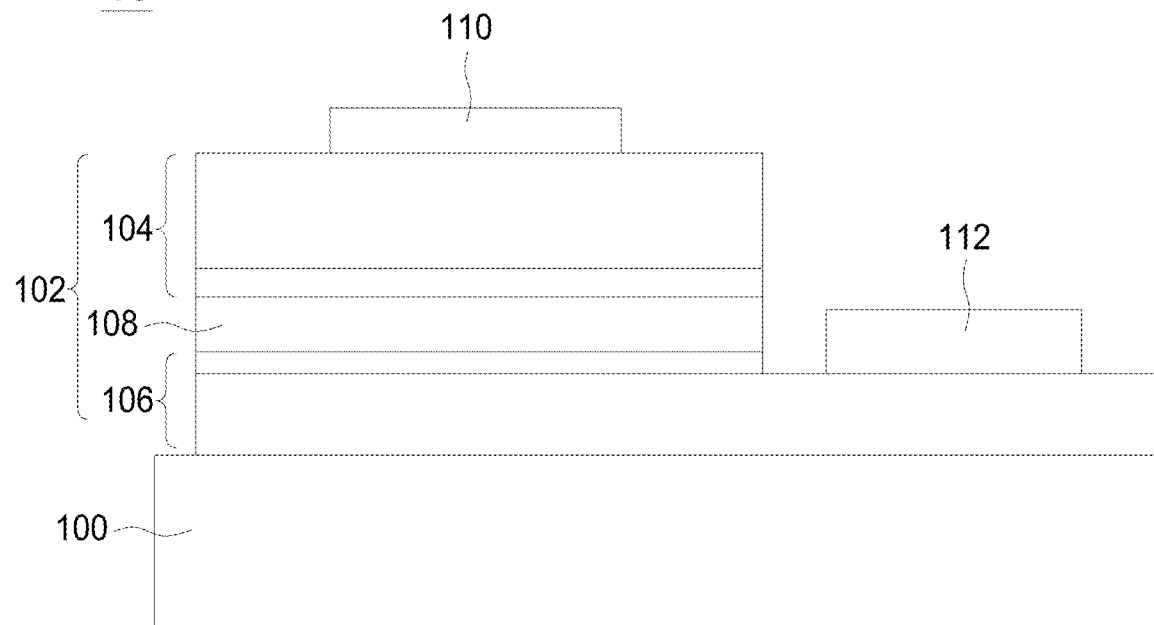
FIG. 1F shows a schematic sectional view of a semiconductor device in accordance with an embodiment of the present disclosure.

FIG. 1E shows a schematic top view of a semiconductor device 40 in accordance with an embodiment of the present disclosure. FIG. 1F shows a schematic sectional view of a semiconductor device 40 in FIG. 1E along the line Y-Y'. The difference between the semiconductor device 40 and the semiconductor device 10 includes that the first electrode 110 and the second electrode 112 in the semiconductor device 40 are located on the same side of the base 100, while the first electrode 110 and the second electrode 112 in the semiconductor device 10 are located on two different sides of the base 100. In the embodiment, the epitaxial structure 102 is located on the base 100, and the first electrode 110 and the second electrode 112 are also located on the epitaxial structure 102. In the embodiment, the first electrode 110 physically contacts the first semiconductor structure 104 and the second electrode 112 physically contacts the second semiconductor structure 106. In another embodiment, the first electrode 110 physically contacts the second semiconductor structure 106 and the second electrode 112 physically contacts the first semiconductor structure 104. In the embodiment, the widths of the first semiconductor structure 104 and the active region 108 are smaller than the width of the second semiconductor structure 106. Although the first semiconductor structure 104 is shown on the active region 108 and the second semiconductor structure 106 is under the active region 108 in FIG. 1F, in another embodiment, the first semiconductor structure 104 is located under the active region 108 and connects to the base 100, and the second semiconductor structure 106 is located on the active region 108 and connects to the second electrode 112. In some embodiments, the insulating layer 120, the conductive layer 122, the reflective layer 124, or the bonding structure 128 described in the previous embodiments can be located between the second semiconductor structure 106 or the first semiconductor structure 104 and the base 100. In an embodiment, the bonding structure 128 includes a conductive or non-conductive material. For the positions, materials, and related descriptions of other layers or structures, the foregoing embodiments can be referred to, and are not repeatedly described herein.

Figure 2A:
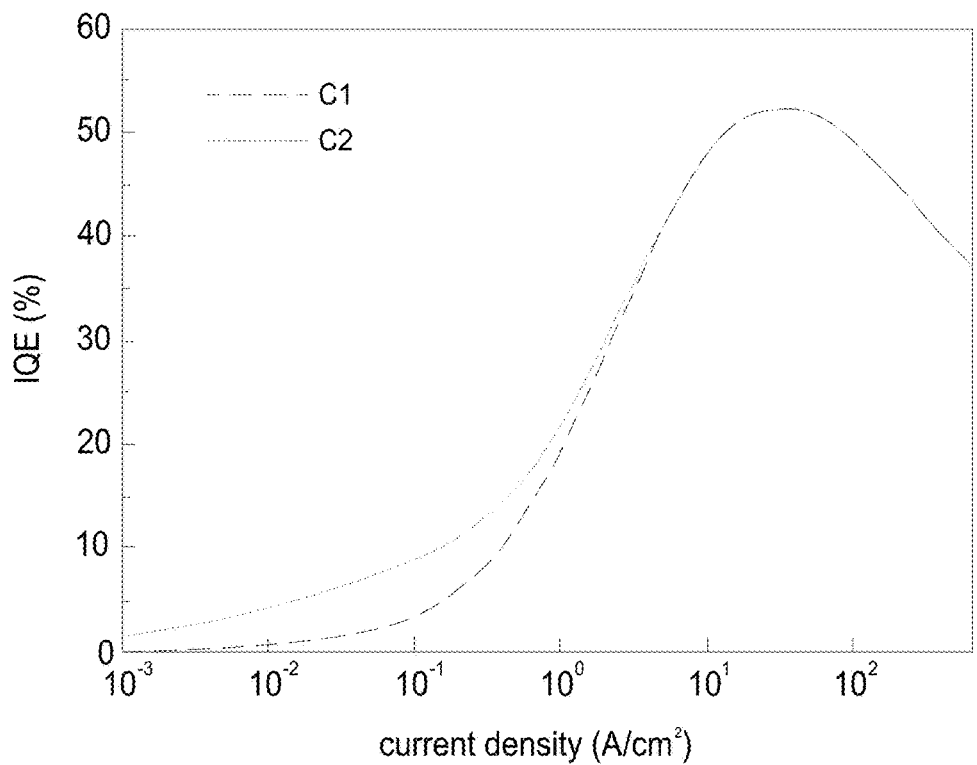
FIG. 2A shows a schematic diagram of the relationship between the current density and the internal quantum efficiency (IQE) of the semiconductor device in accordance with an embodiment of the present disclosure.

FIG. 2A shows a schematic diagram of the relationship between the current density and the internal quantum efficiency (IQE) of the semiconductor device in accordance with an embodiment of the present disclosure. Specifically, FIG. 2A shows the IQE performances obtained by simulation with APSYS (Crosslight Software Inc.), which is a simulation software tool for semiconductor devices. The curve C1 shown in FIG. 2A corresponds to a semiconductor device having a structure without doping in the active region 108, and the curve C2 corresponds to a semiconductor device having a structure containing the first dopant in the active region 108 with a doping concentration of about $1\times10^{16}/cm^3$. As shown in FIG. 2A, the two semiconductor devices both have the maximum IQE value at a current density of about $30A/cm^2$. Specifically, in the low current density range which is below $1A/cm^2$, the semiconductor device with the first dopant in the active region 108 has a higher IQE value than the semiconductor device without doping in the active region 108 does. Therefore, when the first dopant exists in the active region, it helps to increase the IQE value, which is improved especially at a low current density (for example, below 1A/cm$^2$).

Figure 2B:
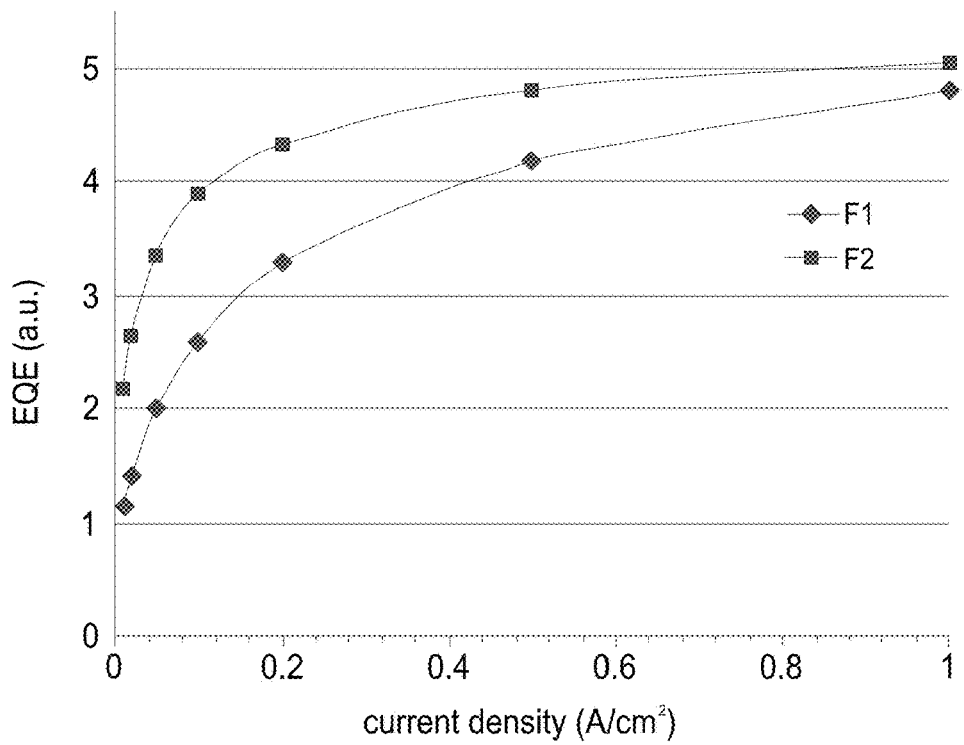
FIG. 2B shows a schematic diagram of the relationship between the current density and the external quantum efficiency (EQE) of the semiconductor device in accordance with an embodiment of the present disclosure.

FIG. 2B shows a schematic diagram of the relationship between the current density and the external quantum efficiency (EQE) of the semiconductor device in accordance with an embodiment of the present disclosure. The curve F1 corresponds to a semiconductor device having a structure without doping in the active region 108 and the curve F2 corresponds to a semiconductor device having structure containing the first dopant in the active region 108. As shown in FIG. 2B, in the low current density range below 1 A/cm$^2$ (for example, 0.001 to 1 A/cm$^2$), the semiconductor device with the first dopant in the active region 108 has a higher external quantum efficiency.

Figure 2C:
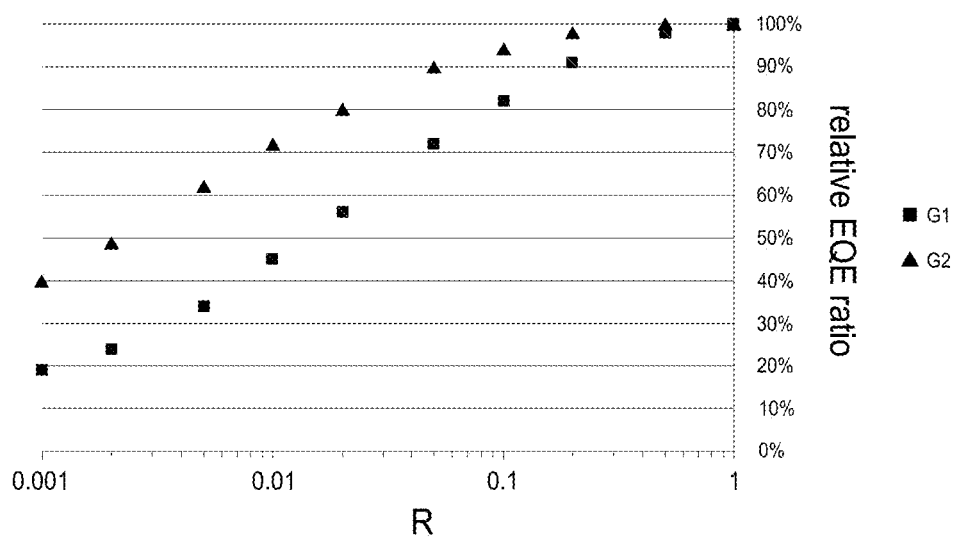
FIG. 2C shows a schematic diagram of the relationship between a factor R and a relative EQE ratio of the semiconductor device in accordance with an embodiment of the present disclosure.

FIG. 2C shows a schematic diagram of the relationship between the factor R and a relative EQE ratio of the semiconductor device in accordance with an embodiment of the present disclosure. The curve G1 corresponds to a semiconductor device having a structure without doping in the active region 108 and the curve G2 corresponds to a semiconductor device having structure containing the first dopant in the active region 108. When measuring the EQEs of the semiconductor devices corresponding to the curve G1 and the curve G2 in a current density range of 0.001 A/cm$^2$ to 100 A/cm$^2$, each semiconductor device has a maximum external quantum efficiency $E_{max}$%, and the current density corresponding to the maximum external quantum efficiency $E_{max}$% is defined as $J\_E_{max}$ A/cm$^2$. In FIG. 2C, R=1 corresponds to the relative EQE ratio at the current density of $1*(J\_E_{max})$ A/cm$^2$, and the relative EQE ratios corresponding to different current densities ranged from $0.001*(J\_E_{max})$ A/cm$^2$ to $1*(J\_E_{max})$ A/cm$^2$ (i.e. from R=0.001 to R=1) are shown in FIG. 2C. Specifically, the relative EQE ratios are obtained by setting $E_{max}$% as 100% and calculating the percentage of EQE value to $E_{max}$% at different current densities. As shown in FIG. 2C, the semiconductor device with the first dopant in the active region 108 has a better EQE performance in the current density range lower than $1*(J\_E_{max})$ A/cm$^2$. For example, at a current density of $0.001*(J\_E_{max})$ A/cm$^2$, the performance of the semiconductor device with the first dopant in the active region 108 is better than the semiconductor device without doping in the active region 108.

Figure 2D:
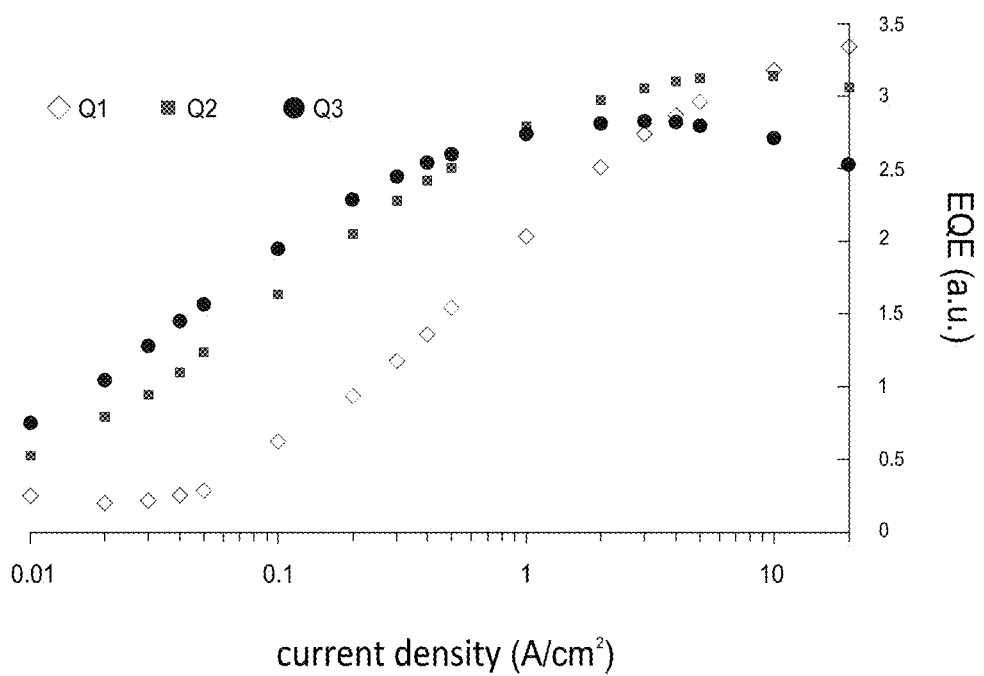
FIG. 2D shows a schematic diagram of the relationship between the current density and the external quantum efficiency (EQE) of the semiconductor devices in accordance with embodiments of the present disclosure.

FIG. 2D shows a schematic diagram of the relationship between the current density and the external quantum efficiency (EQE) of the semiconductor devices in accordance with embodiments of the present disclosure. The difference between the semiconductor devices corresponding to the curves Q1 to Q3 lies in the Al content in the barrier layer. The curve Q1 corresponds to a semiconductor device having an Al content of about 17.5% in each barrier layer 108a, the curve Q2 corresponds to a semiconductor device having an Al content of about 35% in each barrier layer 108a and the curve Q3 corresponds to a semiconductor device having an Al content of about 50% in each barrier layer 108a. It can be seen from FIG. 2D that when the current density is lower than or equal to 1 A/cm$^2$, increasing the Al content in the barrier layer 108a helps to improve the EE performance of the semiconductor device.

Figure 3:
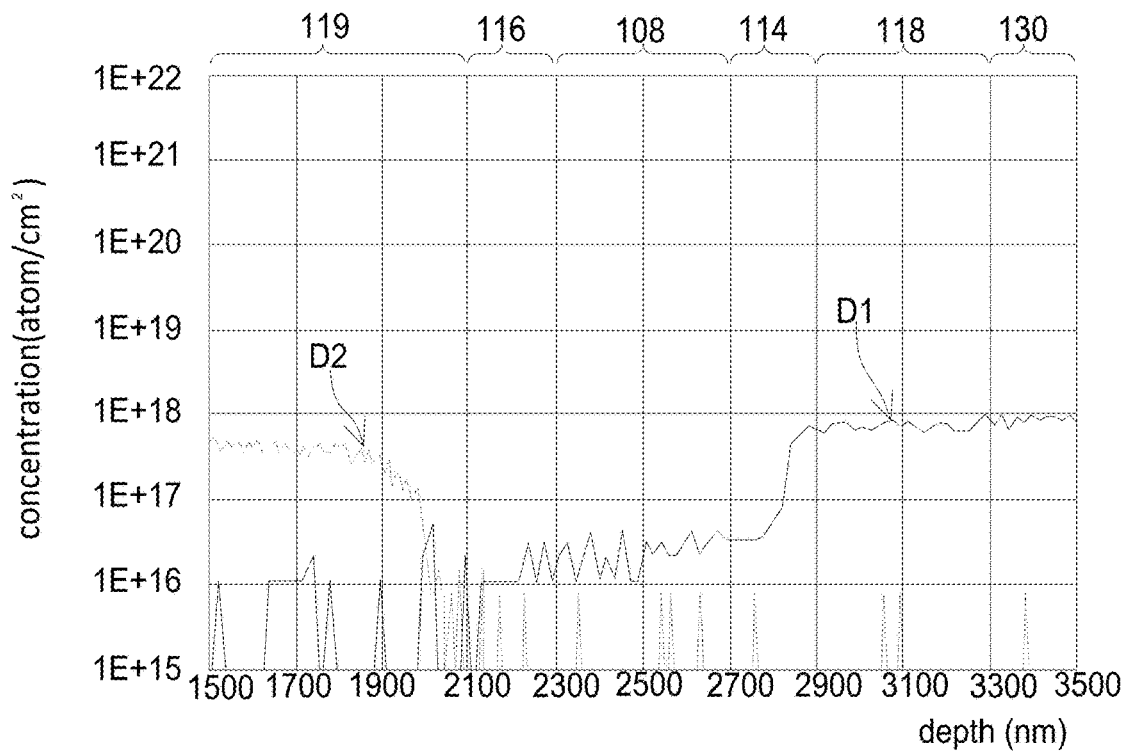
FIG. 3 shows a diagram of the relationship between the concentration of elements and depths in a portion of a semiconductor device in accordance with an embodiment of the disclosure.

FIG. 3 shows a diagram of the relationship between the concentration of elements and depths in a portion of a semiconductor device in accordance with an embodiment of the disclosure. Specifically, FIG. 3 shows the result of SIMS analysis in a portion of the semiconductor device 10 containing the first dopant and the second dopant. As shown in FIG. 3, the semiconductor device 10 of the embodiment sequentially includes a second cladding layer 119, a second confinement layer 116, an active region 108, a first confinement layer 114, a first cladding layer 118, and a first window layer 130. In the embodiment, the second cladding layer 119 includes AlInP, the second confinement layer 116 includes AlGaInP, the active region 108 includes 16 semiconductor pairs 108c (i.e. 16 barrier layers 108a and 16 well layers 108b), the barrier layers 108a and the well layers 108b include AlGaInP, and the first confinement layer 114 includes AlGaInP; the first cladding layer 118 includes AlInP and the first window layer 130 includes AlGaInP. The curve D1 shown in FIG. 3 represents the dopant concentration of the first dopant and the curve D2 represents the dopant concentration of the second dopant. In the embodiment, the first dopant is distributed in the range from the first window layer 130 to the second confinement layer 116, and the second dopant is mainly distributed in the second cladding layer 119 and the second confinement layer 116. As shown in FIG. 3, the doping concentration of the second dopant in the second confinement layer 116 is lower than the doping concentration of the second dopant in the second cladding layer 119.

Figure 4:
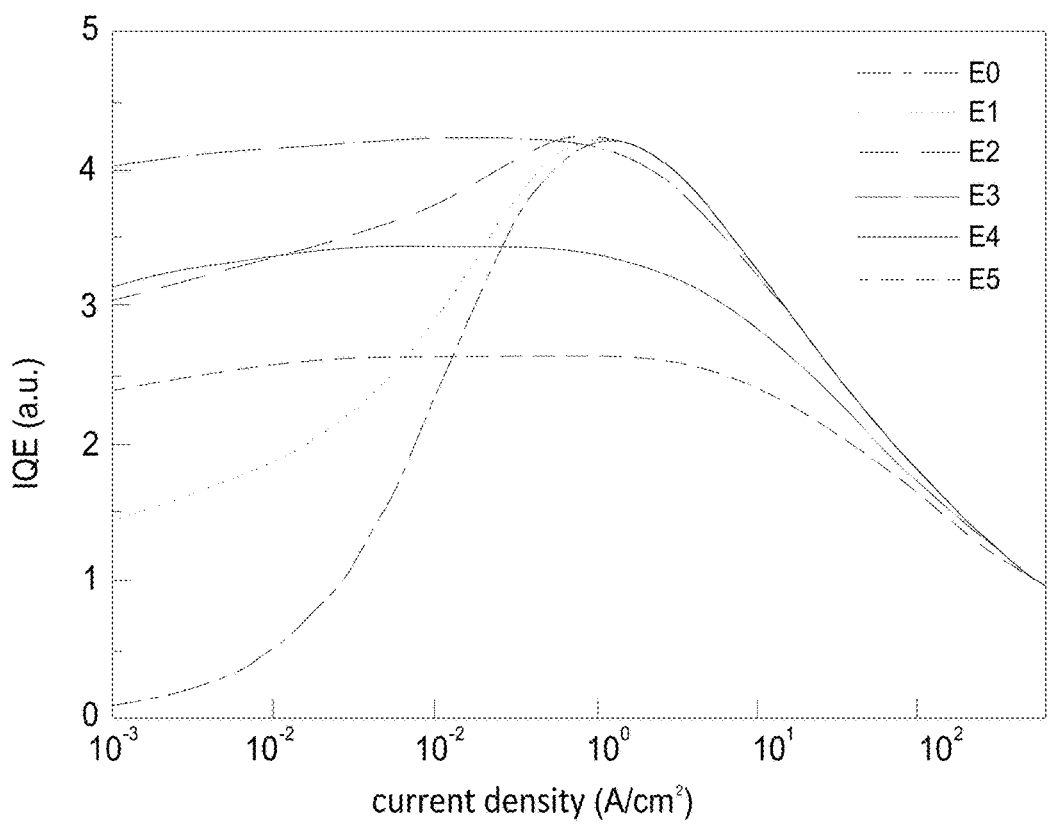
FIG. 4 shows a schematic diagram of the relationship between the current density and the internal quantum efficiency (IQE) of the semiconductor devices in accordance with embodiments of the present disclosure.

FIG. 4 shows a schematic diagram of the relationship between the current density and the internal quantum efficiency (IQE) of the semiconductor devices in accordance with embodiments of the present disclosure. Specifically, FIG. 4 shows the IQE performance obtained by simulation with APSYS (Crosslight Software Inc.), which is a simulation software tool for semiconductor devices. The difference between the semiconductor devices lies in the doping concentrations of the first dopant in the active region 108. In detail, the curve E0 corresponds to a semiconductor device having a structure without doping in the active region 108, and the curves E1 to E5 corresponds to semiconductor devices having structures in which the doping concentration of the first dopant in the active region 108 are about $1\times10^{16}$/cm$^3$, $5\times10^{16}$/cm$^3$, $1\times10^{17}$/cm$^3$, $5\times10^{17}$/cm$^3$, and $1\times10^{18}$/cm$^3$, respectively. As shown in FIG. 4, in the embodiment, at a low current density lower than or equal to 1 A/cm$^2$, the structures with the doping concentration of the first dopant approximately in the range of $1\times10^{16}$/cm$^3$ to $1\times10^{17}$/cm$^3$ (the curves E1 to E3) have a better IQE than the structure without doping in the active region 108 (the curve E0). In the embodiment, when the doping concentration of the first dopant is increased to about $1\times10^{17}$/cm$^3$, the maximum IQE value can be found at a current density lower than or equal to 1 A/cm$^2$. When the doping concentration of the first dopant is increased to about $5\times10^{17}$/cm$^3$ or $1\times10^{18}$/cm$^3$ (the curves E4 or E5), the IQE performance is still better than that of the structure without doping in the active region 108 (the curve E0) at some current densities. It can be seen from FIG. 4 that in the embodiment, by the presence of the first dopant in a specific doping concentration range in the active region 108, the quantum efficiency performance of the semiconductor device at a low current density (such as 1 A/cm$^2$ or less) can be improved while maintaining the maximum quantum efficiency of the semiconductor device.

Figure 5A:
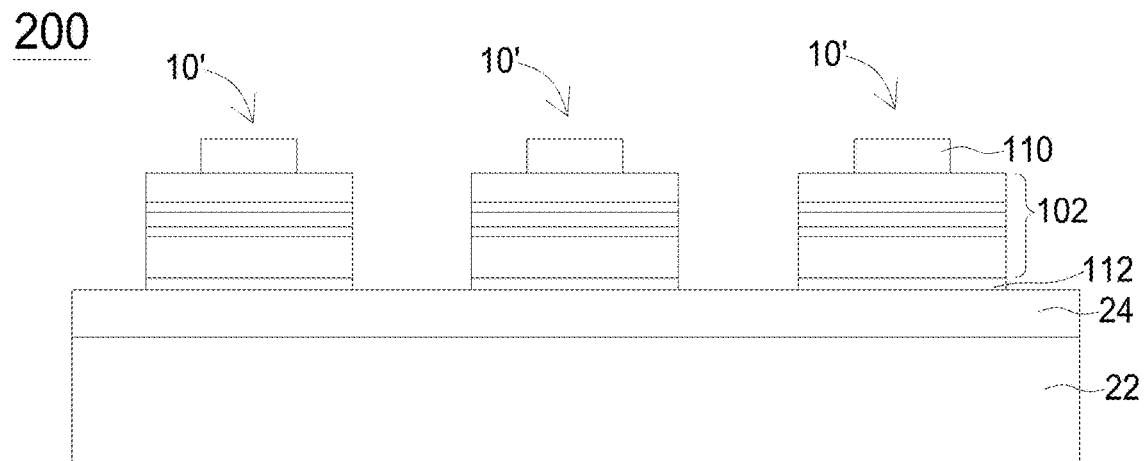
FIG. 5A shows a schematic sectional view of a semiconductor component in accordance with an embodiment of the present disclosure.

FIG. 5A shows a schematic sectional view of a semiconductor component 200 in accordance with an embodiment of the present disclosure. As shown in FIG. 5A, the semiconductor component 200 includes a carrier substrate 22, an adhesive layer 24 on the carrier substrate 22, and a plurality of semiconductor devices 10' on the adhesive layer 24. In the embodiment, the semiconductor device 10' does not include the base and includes the epitaxial structure 102, the first electrode 110 and the second electrode 112 as described in each embodiment. The first electrode 110 and the second electrode 112 are located on two different sides of the epitaxial structure 102. The carrier substrate 22 is connected to the semiconductor devices 10' through the adhesive layer 24. In an embodiment, the carrier substrate 22 includes a conductive material or an insulating material, such as sapphire, glass, gallium arsenide (GaAs), indium phosphide (InP), silicon carbide (SiC), gallium phosphide (GaP), zinc oxide (ZnO), and nitride Gallium (GaN), aluminum nitride (AlN), germanium (Ge) or silicon (Si). In an embodiment, the material of the adhesive layer 24 includes a polymer material, such as benzocyclobutene (BCB), epoxy, polyimide, silicone or SOG (Spin-On-Glass). For the positions, materials, and related descriptions of other layers or structures, the foregoing embodiments can be referred to, and are not repeatedly described herein.

Figure 5B:
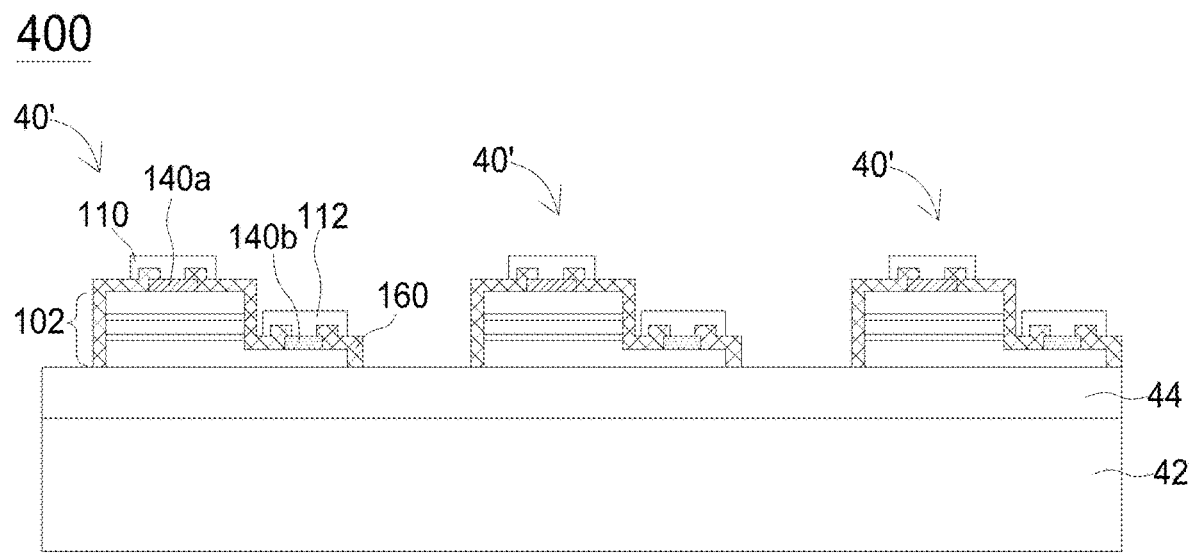
FIG. 5B shows a schematic sectional view of a semiconductor component in accordance with an embodiment of the present disclosure.

FIG. 5B shows a schematic sectional view of a semiconductor component 400 in accordance with an embodiment of the present disclosure. As shown in FIG. 5B, the semiconductor component 400 includes a carrier substrate 42, an adhesive layer 44 on the carrier substrate 42, and a plurality of semiconductor devices 40' on the adhesive layer 44. In the embodiment, the semiconductor device 40' does not include the base and the semiconductor device 40' includes the epitaxial structure 102, the first electrode 110 and the second electrode 112 as described in each embodiment. The first electrode 110 and the second electrode 112 are located on one side of the epitaxial structure 102. The semiconductor device 40' further includes a first contact structure 140a between the first electrode 110 and the epitaxial structure 102 and a second contact structure 140b between the second electrode 112 and the epitaxial structure 102. In an embodiment, the first contact structure 140a and the second contact structure 140b respectively include a group III-V semiconductor material, metal, or alloy. The semiconductor device 40' further includes a dielectric layer 160 covering the epitaxial structure 102. The dielectric layer 160 has openings. As shown in FIG. 5B, the first electrode 110 and the second electrode 112 fill the openings of the dielectric layer 160 to be electrically connected to the first contact structure 140a and the second contact structure 140b, respectively. Regarding the carrier substrate 42 and the adhesive layer 44, reference can be made to the description of the carrier substrate 22 and the adhesive layer 24, respectively. For the positions, materials, and related descriptions of other layers or structures, the foregoing embodiments can be referred to, and are not repeatedly described herein.

Figure 6:
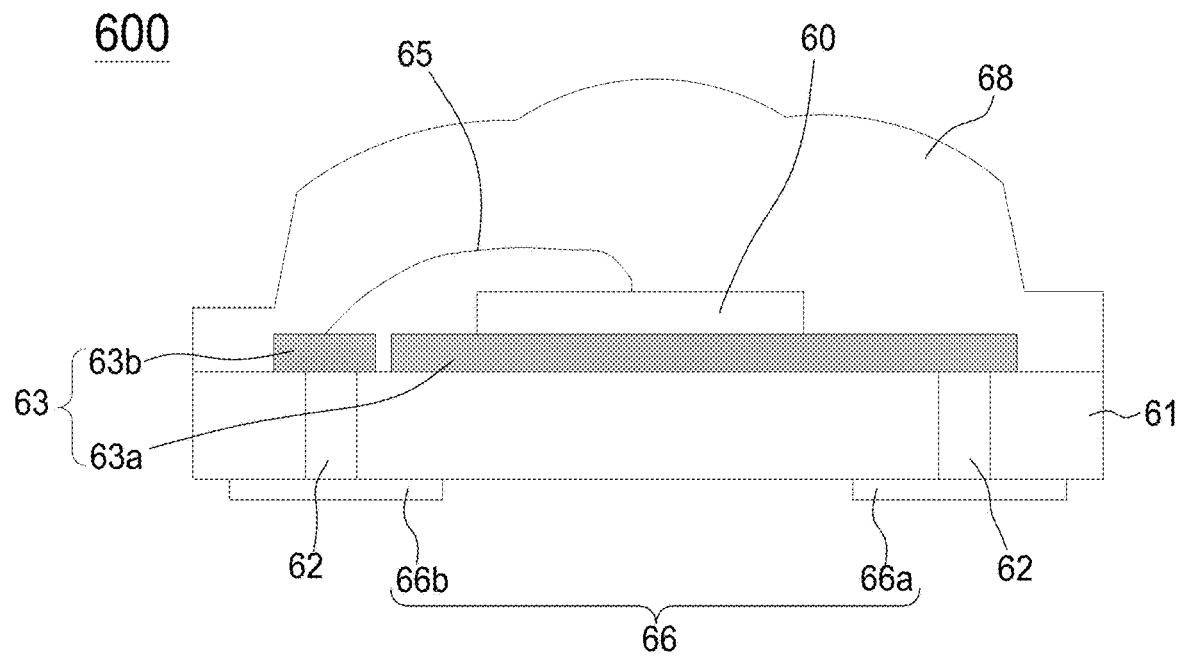
FIG. 6 shows a schematic sectional view of a semiconductor component in accordance with an embodiment of the present disclosure.

FIG. 6 shows a schematic sectional view of a semiconductor component 600 in accordance with an embodiment of the present disclosure. As shown in FIG. 6, the semiconductor component 600 includes a semiconductor device 60, a package substrate 61, a carrier 63, a bonding wire 65, a contact structure 66 and an encapsulating material 68. In an embodiment, the package substrate 61 includes a ceramic or glass. The package substrate 61 has a plurality of through holes 62. In an embodiment, each through hole 62 is filled with a conductive material such as metal for electrical conduction and/or heat dissipation. In an embodiment, the carrier 63 is located on a surface of one side of the package substrate 61 and also contains a conductive material such as metal. The contact structure 66 is on a surface on another side of the package substrate 61. In the embodiment, the contact structure 66 includes a first contact pad 66a and a second contact pad 66b, and the first contact pad 66a and the second contact pad 66b can be electrically connected to the carrier 63 via the through holes 62. In an embodiment, the contact structure 66 further includes a thermal pad (not shown) between the first contact pad 66a and the second contact pad 66b.

The semiconductor device 60 is located on the carrier 63. The semiconductor device 60 can be the semiconductor device as described in any embodiments of the present disclosure (for example, the semiconductor device 10, 10', 20, 40, or 40'). In the embodiment, the carrier 63 includes a first portion 63a and a second portion 63b, and the semiconductor device 60 is electrically connected to the second portion 63b of the carrier 63 by a bonding wire 65. In an embodiment, the material of the bonding wire 65 includes metal, such as gold (Au), silver (Ag), copper (Cu), or aluminum (Al), or includes alloy containing one of the aforementioned metals. In the embodiment, the encapsulating material 68 covers the semiconductor device 60 to protect the semiconductor device 60. Specifically, in an embodiment, the encapsulating material 68 includes a resin material, such as an epoxy resin, or a silicone resin. In an embodiment, the encapsulating material 68 further includes a plurality of wavelength conversion particles (not shown) to convert a first light emitted by the semiconductor device 60 into a second light. The wavelength of the second light is greater than the wavelength of the first light.

Figure 7:
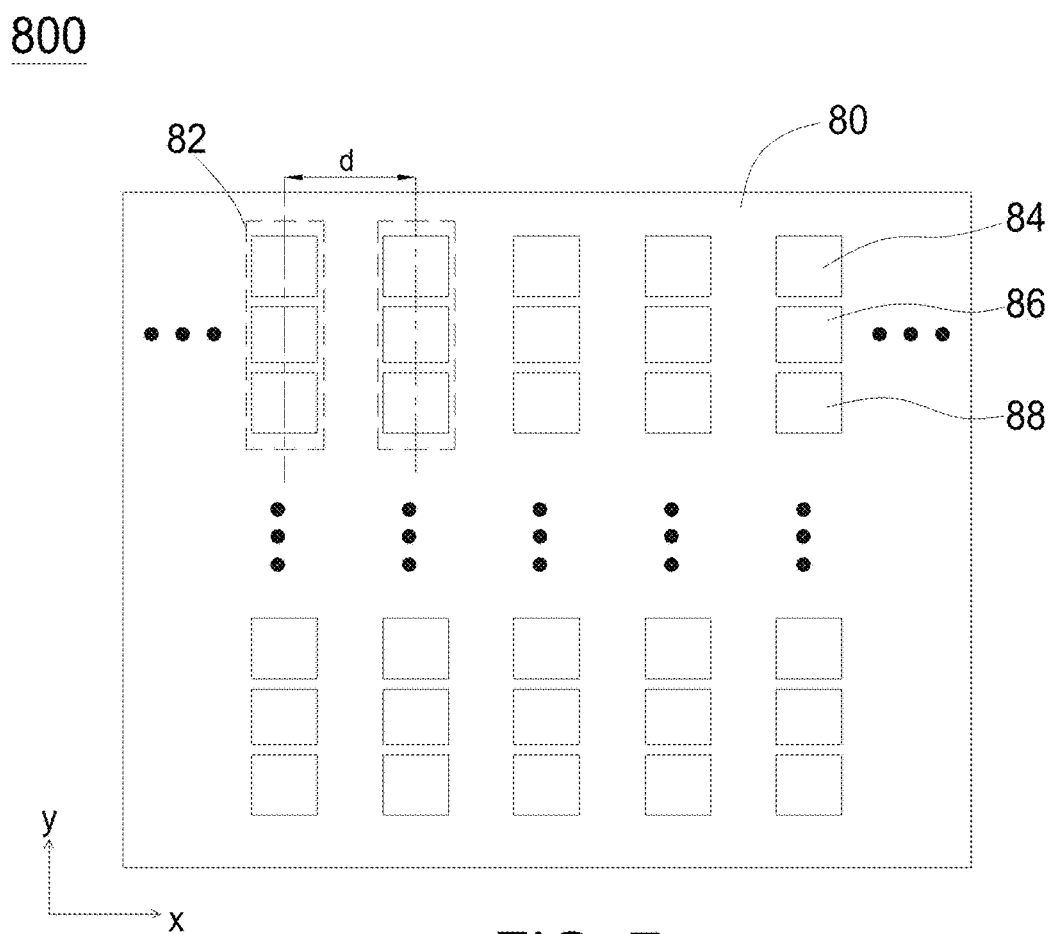
FIG. 7 shows a schematic top view of a semiconductor component in accordance with an embodiment of the present disclosure.

FIG. 7 shows a schematic top view of a semiconductor component 800 in accordance with an embodiment of the present disclosure. The semiconductor component 800 of the embodiment is, for example, a display. As shown in FIG. 7, the semiconductor component 800 includes a carrier board 80 and a plurality of pixel units 82 on the carrier board 80. The plurality of pixel units 82 are arranged in an array along the directions parallel to the x-axis and the y-axis, and are arranged at an interval d in the direction parallel to the x-axis. The number of pixel units 82 can be adjusted based on actual needs. For example, in an embodiment, a display with a resolution of 1920×1080 pixels is provided by the plurality of pixel units 82 included in the semiconductor component 800. In an embodiment, the interval d is less than 1.4 mm, for example, the interval d is in a range of 0.2 mm to 1.3 mm, such as 0.75 mm, 0.8 mm, 1 mm or 1.25 mm. As shown in FIG. 7, each pixel unit 82 includes a first semiconductor device 84, a second semiconductor device 86, and a third semiconductor device 88 arranged in a direction parallel to the y-axis. One or more of the first semiconductor device 84, the second semiconductor device 86, and the third semiconductor device 88 is the semiconductor device described in any embodiment of the present disclosure (such as the semiconductor device 10, 10', 20, 40, or 40'). In an embodiment, the first semiconductor device 84, the second semiconductor device 86, and the third semiconductor device 88 are all light-emitting devices and can emit red light, green light, and blue light, respectively. In an embodiment, the arrangement order of the light-emitting devices can also be adjusted based on actual needs. For example, the first semiconductor device 84, the second semiconductor device 86, and the third semiconductor device 88 emit red light, blue light, and green light, respectively. Each pixel unit 82 can be electrically connected to a circuit (not shown) on the surface of the carrier board 80, so that the light-emitting devices therein can receive an external signal and emit light in accordance with the external signal. The carrier board 80 may have a single-layer or multi-layer structure. In an embodiment, the material of the carrier board 80 includes a polyester, polyimide (PI), BT resin (Bismaleimide Triazine), PTFE resin (Polytetrafluoroethylene), phenol resin (Phenol resins, PF) or glass fiber epoxy resin (such as FR4). In an embodiment, the carrier board 80 can be bent, and for example, can withstand a radius of curvature less than 50 mm, such as 25 mm or 32 mm.

It can be seen from above that when the length $L_0$ and width $W_0$ of the semiconductor device are within the aforementioned range (less than or equal to 500 µm) and the operating current of the semiconductor device is between 0.001 mA and 100 mA and/or the current density is between 0.001 A/cm$^2$ and 100 A/cm$^2$, the number of the semiconductor pair 108c in the active region 108 and/or the first aluminum content and/or the thickness of the barrier layer 108a and the well layer 108b and/or the first or second thickness of the confinement layer and/or the aluminum content of the first or second confinement layer and/or the concentration of the first dopant in the active region 108 may affect the quantum efficiency of the semiconductor device.

Specifically, in an embodiment, when the operating current is between 0.01 mA and 5 mA and/or the current density is between 0.01 A/cm$^2$ and 5 A/cm$^2$, an epitaxial structure or semiconductor device satisfies any one or a combination of any two or more of the following conditions (i) to (vi) can have relatively high quantum efficiency: (i) the first aluminum content is greater than or equal to 25%; (ii) the ratio of the first thickness to the second thickness is in the range of 2:1 to 40:1; (iii) the number of the semiconductor pair 108c in the active region 108 is less than 10; (iv) the third/fourth aluminum content is greater than the second aluminum content; (v) the third thickness is greater than or equal to the second thickness and the fourth thickness is greater than or equal to the second thickness; (vi) the active region 108 contains the first dopant. Furthermore, when the length $L_0$ of the semiconductor device 10 is less than 200 µm and the width $W_0$ is less than 200 µm and/or the epitaxial structure 102 has a top-view area in the range of 50 µm$^2$ to 2000 µm$^2$, the epitaxial structures or semiconductor device which satisfies any one or a combination of two or more of the aforementioned conditions (i) to (vi) has an improved quantum efficiency.

In accordance with some embodiments, when the external quantum efficiency (for example, in %) of the epitaxial structure or the semiconductor device is measured at different current densities (for example, in the range of 0.001 to 100 A/cm$^2$, such as 0.001 to 0.01, 0.1, 1, 5, 10 or 50 A/cm$^2$), the epitaxial structure or semiconductor device that satisfies any one or a combination of two or more of the aforementioned conditions (i) to (vi) has a maximum external quantum efficiency $E_{1max}$% within the aforementioned current density range, and the current density corresponding to the maximum external quantum efficiency $E_{1max}$% is defined as $J\_E_{1max}$ A/cm$^2$. The external quantum efficiency is, for example, measured by an integrating sphere system. At a current density of $0.1*(J\_E_{1max})$ A/cm$^2$, the aforementioned epitaxial structure or semiconductor device can have an external quantum efficiency greater than or equal to 80% of $E_{1max}$%, and can further have an external quantum efficiency greater than or equal to 85% or 90% of $E_{1max}$%. At a current density of $0.01*(J\_E_{1max})$ A/cm$^2$, the aforementioned epitaxial structure or semiconductor device can have an external quantum efficiency greater than or equal to 50% of $E_{1max}$%, and can further have an external quantum efficiency greater than or equal to 60% or 70% of $E_{1max}$%. At a current density of $0.001*(J\_E_{1max})$ A/cm$^2$, the aforementioned epitaxial structure or semiconductor device can have an external quantum efficiency greater than or equal to 15% of $E_{1max}$%, and can further have an external quantum efficiency greater than or equal to 20%, 25%, 30%, or 40% of $E_{1max}$%.

In accordance with some embodiments, when the external quantum efficiency (for example, in %) of the epitaxial structure or the semiconductor device is measured at different currents (for example, in the range of 0.001 to 100 mA, such as 0.001 to 0.01, 0.1, 1, 5, 10, 20, 30, 40 or 50 mA), an epitaxial structure or semiconductor device that satisfies any one or a combination of two or more of the aforementioned conditions (i) to (vi) has a maximum external quantum efficiency $E_{2max}$% within the aforementioned current range, and the current corresponding to the maximum external quantum efficiency $E_{2max}$% is defined as $C\_E_{2max}$ mA. The external quantum efficiency is, for example, measured by an integrating sphere system. $E_{2max}$% can be 80% or more, and can be greater than or equal to 85% or 90%. At a current of $0.01*(C\_E_{2max})$ mA, the aforementioned epitaxial structure or semiconductor device can have an external quantum efficiency greater than or equal to 50% of $E_{2max}$%, and can further have an external quantum efficiency greater than or equal to 60% or 70% of $E_{2max}$%. At a current of $0.001*(C\_E_{2max})$ mA, the aforementioned epitaxial structure or semiconductor device can have an external quantum efficiency greater than or equal to 15% of $E_{2max}$%, and can further have an external quantum efficiency greater than or equal to 20%, 25%, 30%, or 40% of $E_{2max}$%.

In accordance with some embodiments, an epitaxial structure or semiconductor device which satisfies any one or a combination of two or more of the aforementioned conditions (i) to (vi) can have a first light output value O1 (for example, in lm (lumen)) at a first temperature, and have a second light output value O2 at a second temperature, wherein the second temperature is lower than the first temperature. The first temperature and the second temperature represent, for example, different environmental temperatures for testing or operating the epitaxial structure/semiconductor device. In some embodiments, the ratio of the first light output value O1 to the second light output value O2 is greater than or equal to 30%, such as 40%, 50%, 60%, 70%, 80%, or 90%. The ratio of the first light output value O1 to the second light output value O2 may be less than or equal to 100%. In some embodiments, the difference between the first temperature and the second temperature is greater than or equal to 30° C., such as about 40° C., 50° C., 60° C., 70° C., or 80° C. In an embodiment, the second temperature is room temperature (for example, about 25° C.), and the first temperature is about 85° C. That is, the light output value of the epitaxial structure or semiconductor device that satisfies any one or a combination of any two or more of the aforementioned conditions (i) to (vi) is less affected by temperature changes, and can have a lower temperature dependence.

Based on the above, in accordance with the embodiments of the present disclosure, an epitaxial structure, a semiconductor device, or a semiconductor component can be provided. For example, the internal or external quantum efficiency of the epitaxial structure, the semiconductor device, or the semiconductor component can be further improved, especially when operated at a low current (such as 10 mA or less) or a low current density (such as 1 A/cm$^2$ or less) operation and/or where miniaturization is required. In detail, the epitaxial structure, the semiconductor device or semiconductor component of the present disclosure can be improved in terms of surface recombination velocity (SRV), temperature dependence, current spreading, and efficiency droop in operation. Specifically, the epitaxial structure, the semiconductor device or the semiconductor component of the present disclosure can be applied to products in various fields, such as illumination, medical care, display, communication, sensing, or power supply system. For example, the semiconductor device can be used in a light fixture, monitor, mobile phone, tablet, an automotive instrument panel, a television, computer, wearable device (such as watch, bracelet or necklace), traffic sign, outdoor display device, or medical device.

Based on above, the semiconductor device provided in the present disclosure exhibits a good epitaxial quality and improved optical-electrical characteristics, such as light-emitting power, wavelength stability and/or reliability. Specifically, the semiconductor device of the present disclosure can be applied to products in various fields, such as illumination, medical care, display, communication, sensing, or power supply system. For example, the semiconductor device can be used in a light fixture, monitor, mobile phone, or tablet, an automotive instrument panel, a television, computer, wearable device (such as watch, bracelet or necklace), traffic sign, outdoor display device, or medical device.

It should be realized that each of the embodiments mentioned in the present disclosure is used for describing the present disclosure, but not for limiting the scope of the present disclosure. Any obvious modification or alteration is not departing from the spirit and scope of the present disclosure. Furthermore, aforementioned embodiments can be combined or substituted under proper condition and are not limited to specific embodiments described above. A connection relationship between a specific component and another component specifically described in an embodiment can also be applied in another embodiment and is within the scope as claimed in the present disclosure.

What is claimed is:

1. A semiconductor device, comprising:
a first semiconductor structure comprising a first dopant;
a second semiconductor structure located on the first semiconductor structure and comprising a second dopant different from the first dopant; and
an active region comprising a plurality of semiconductor pairs and located between the first semiconductor structure and the second semiconductor structure wherein one of the plurality of semiconductor pairs has a barrier layer and a well layer and comprises the first dopant,
wherein the first semiconductor structure further comprises a first confinement layer physically contacts the active region, and the first confinement layer has a third Al content and a third thickness, the second semiconductor structure further comprises a second confinement layer physically contacts the active region, and the second confinement layer has a fourth Al content and a fourth thickness, wherein the third Al content is greater than the second Al content and the fourth Al content is greater than the second Al content; wherein the third thickness is greater than or equal to the second thickness and the fourth thickness is greater than or equal to the second thickness: and
wherein the barrier layer has a first thickness and a first Al content, and the well layer has a second thickness and a second Al content, wherein the second thickness is less than the first thickness, and the second Al content is less than the first Al content.

2. The semiconductor device of claim 1, wherein the semiconductor device has a rectangular shape in a top view and the rectangle has a length and a width that are respectively less than or equal to 500 µm and greater than 1 µm.

3. The semiconductor device of claim 1, wherein the first Al content is 25% or more.

4. The semiconductor device of claim 1, wherein a ratio of the first thickness to the second thickness is in a range of 2:1 to 40:1.

5. The semiconductor device of claim 1, wherein the number of the semiconductor pairs is less than or equal to 10.

6. The semiconductor device of claim 1, wherein the first dopant comprises a group II element, a group IV element, or a group VI element of the periodic table.

7. The semiconductor device of claim 1, wherein the first dopant has a doping concentration greater than or equal to $1 \times 10^{16}/cm^3$ in the active region.

* * * * *